US008436363B2

(12) United States Patent
Werkhoven et al.

(10) Patent No.: US 8,436,363 B2
(45) Date of Patent: May 7, 2013

(54) METALLIC CARRIER FOR LAYER TRANSFER AND METHODS FOR FORMING THE SAME

(75) Inventors: Christiaan J. Werkhoven, Gilbert, AZ (US); Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/020,288

(22) Filed: Feb. 3, 2011

(65) Prior Publication Data

US 2012/0199845 A1    Aug. 9, 2012

(51) Int. Cl.
*H01L 31/0256* (2006.01)

(52) U.S. Cl.
USPC .............. 257/76; 257/E29.089; 257/E33.025

(58) Field of Classification Search ............... 257/77, 257/76, E29.089, E33.025; 438/29
See application file for complete search history.

(56) References Cited

U.S. PATENT DOCUMENTS

| | | | |
|---|---|---|---|
| 6,010,579 A | 1/2000 | Henley et al. | |
| 6,194,742 B1 | 2/2001 | Kern et al. | |
| 6,303,468 B1 | 10/2001 | Aspar et al. | |
| 6,328,796 B1 | 12/2001 | Kub et al. | |
| 6,335,258 B1 | 1/2002 | Aspar et al. | |
| 6,441,393 B2 | 8/2002 | Goetz et al. | |
| 6,756,286 B1 | 6/2004 | Morceau et al. | |
| 6,794,276 B2 | 9/2004 | Letertre et al. | |
| 6,809,044 B1 | 10/2004 | Aspar et al. | |
| 6,815,309 B2 | 11/2004 | Letertre et al. | |
| 6,858,107 B2 | 2/2005 | Ghyselen et al. | |
| 6,867,067 B2 | 3/2005 | Ghyselen et al. | |
| 6,908,828 B2 | 6/2005 | Letertre et al. | |
| 6,946,365 B2 | 9/2005 | Aspar et al. | |
| 6,964,914 B2 | 11/2005 | Ghyselen et al. | |
| 7,071,029 B2 | 7/2006 | Ghyselen et al. | |
| RE39,484 E | 2/2007 | Bruel | |
| 7,262,466 B2 | 8/2007 | Aitken et al. | |

(Continued)

FOREIGN PATENT DOCUMENTS

| | | |
|---|---|---|
| AT | 514180 T | 7/2011 |
| AT | 534759 T | 12/2011 |

(Continued)

OTHER PUBLICATIONS

3M Fluorinert™ Electronic Liquid FC-77, http://www.parallax-tech.com/images/phys77.pdf, visited Dec. 8, 2011, 4 pages.

(Continued)

*Primary Examiner* — Wael Fahmy
*Assistant Examiner* — Sarah Salerno
(74) *Attorney, Agent, or Firm* — TraskBritt

(57) ABSTRACT

Embodiments relate to semiconductor structures and methods of forming them. In some embodiments, the methods may be used to fabricate a semiconductor substrate by forming a weakened zone in a donor structure at a predetermined depth to define a transfer layer between an attachment surface and the weakened zone and a residual donor structure between the weakened zone and a surface opposite the attachment surface. A metallic layer is formed on the attachment surface and provides an ohmic contact between the metallic layer and the transfer layer, a matched Coefficient of Thermal Expansion (CTE) for the metallic layer that closely matches a CTE of the transfer layer, and sufficient stiffness to provide structural support to the transfer layer. The transfer layer is separated from the donor structure at the weakened zone to form a composite substrate comprising the transfer layer the metallic layer.

37 Claims, 6 Drawing Sheets

U.S. PATENT DOCUMENTS

| | | |
|---|---|---|
| 7,271,416 B2 | 9/2007 | Saxler |
| 7,288,430 B2 | 10/2007 | Faure et al. |
| 7,387,677 B2 | 6/2008 | Dwilinski et al. |
| 7,387,947 B2 | 6/2008 | Cayrefourcq et al. |
| 7,407,869 B2 | 8/2008 | Ghyselen et al. |
| 7,422,957 B2 | 9/2008 | Ghyselen |
| 7,465,991 B2 | 12/2008 | Ghyselen |
| 7,531,428 B2 | 5/2009 | Dupont |
| 7,622,330 B2 | 11/2009 | Ghyselen et al. |
| 7,635,635 B2 | 12/2009 | Yilmaz et al. |
| 7,655,537 B2 | 2/2010 | Ghyselen et al. |
| 7,732,301 B1 | 6/2010 | Pinnington et al. |
| 7,741,678 B2 | 6/2010 | Ghyselen et al. |
| 8,101,451 B1 | 1/2012 | Murali et al. |
| 8,101,498 B2 | 1/2012 | Pinnington et al. |
| 2003/0064535 A1 | 4/2003 | Kub et al. |
| 2003/0219959 A1 | 11/2003 | Ghyselen et al. |
| 2004/0224469 A1 | 11/2004 | Lim et al. |
| 2006/0099776 A1 | 5/2006 | Dupont |
| 2006/0118513 A1 | 6/2006 | Faure et al. |
| 2006/0255341 A1 | 11/2006 | Pinnington et al. |
| 2007/0072324 A1* | 3/2007 | Krames et al. .................. 438/46 |
| 2009/0278233 A1 | 11/2009 | Pinnington et al. |
| 2011/0057165 A1 | 3/2011 | Pinnington |
| 2011/0117726 A1 | 5/2011 | Pinnington et al. |
| 2011/0127581 A1 | 6/2011 | Bethoux et al. |
| 2011/0136281 A1 | 6/2011 | Sheen |
| 2011/0233784 A1 | 9/2011 | Moosburger et al. |

FOREIGN PATENT DOCUMENTS

| | | |
|---|---|---|
| AU | 3213100 A | 8/2000 |
| AU | 2203702 A | 6/2002 |
| CN | 100343424 C | 10/2007 |
| CN | 101273472 A | 9/2008 |
| CN | 100442439 C | 12/2008 |
| CN | 101432846 A | 5/2009 |
| DE | 112007000825 T5 | 4/2009 |
| DE | 102009007625 A1 | 5/2010 |
| EP | 1338030 A2 | 8/2003 |
| EP | 1468128 A2 | 10/2004 |
| EP | 1932186 A1 | 6/2008 |
| FR | 2755537 A1 | 5/1998 |
| FR | 2817395 A1 | 5/2002 |
| FR | 2835096 A1 | 7/2003 |
| FR | 2953328 A1 | 6/2011 |
| JP | 2004519093 A | 6/2004 |
| JP | 2005515150 T | 5/2005 |
| JP | 2007096331 A | 4/2007 |
| JP | 2008538658 T | 10/2008 |
| JP | 2009532913 A | 9/2009 |
| TW | 554452 B | 9/2003 |
| TW | I259221 B | 8/2006 |
| WO | 0044966 A1 | 8/2000 |
| WO | 0243124 A2 | 5/2002 |
| WO | 03062507 A2 | 7/2003 |
| WO | 2006116030 A2 | 11/2006 |
| WO | 2007036865 A1 | 4/2007 |
| WO | 2007117829 A2 | 10/2007 |
| WO | 2009137604 A2 | 11/2009 |
| WO | 2010011842 A2 | 1/2010 |
| WO | 2011031907 A1 | 3/2011 |
| WO | 2011067276 A1 | 6/2011 |
| WO | 2011071922 A1 | 6/2011 |

OTHER PUBLICATIONS

ER3T, Technical Specification, Performance and Applications of the TWR 3000 Advanced System, http://www.r3t.de/documents/TWR_3000_advanced_technical_specification_V1_c_pdf, visited Dec. 8, 2011, 4 pages.

Fluorinert, http://en.wikipedia.org/wiki/FC-77, visited Dec. 8, 2011, 4 pages.

Stolbov et al., First Principles Study of Adsorption, Diffusion and Dissociation of NH3 on Ni and Pd Surfaces, Department of Physics, Cardwell Hall, Kansas State University, (Manhattan, Kansas 55606, U.S.A. (arXiv:condmat/0501060v1, submitted Jan. 5, 2005).

Werkhoven et al., U.S. Appl. No. 13/336,853 entitled, Methods of Fabricating Semiconductor Structures Using Thermal Spray Processes, and Semiconductor Structures Fabricated Using Such methods, filed Dec. 23, 2011.

Werkhoven et al., U.S. Appl. No. 13/336,883 entitled, Semiconductor Devices Including Substrate Layers and Overlying Semiconductor Layers Having Closely Matching Coefficients of Thermal Expansion, and Related Methods, filed Dec. 23, 2011.

French Preliminary Search Report for French Application No. FR1151664 dated Oct. 27, 2011, 2 pages.

French Written Opinion for French Application No. FR1151664 dated Oct. 27, 2011, 5 pages.

* cited by examiner

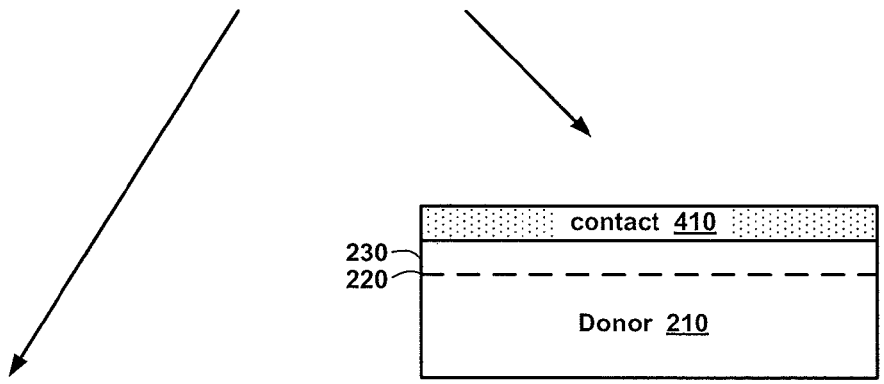
FIG. 2
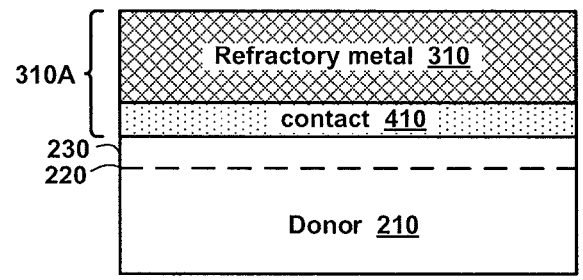
FIG. 4A
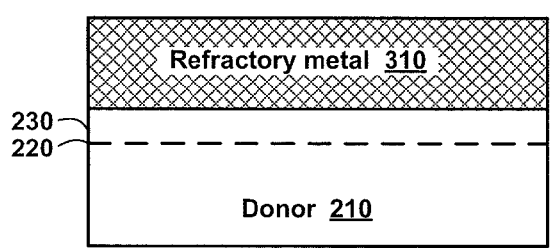
FIG. 3A
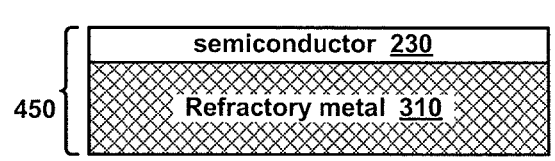
FIG. 3B
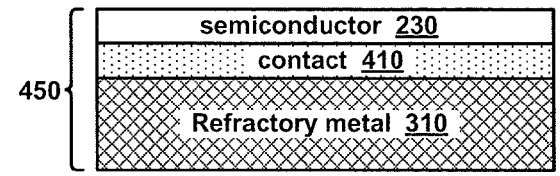
FIG. 4B
FIG. 4C

METALLIC CARRIER FOR LAYER TRANSFER AND METHODS FOR FORMING THE SAME

FIELD

The present invention generally relates to the fabrication of engineered substrates for use in the fabrication of semiconductor structures or devices, intermediate structures formed during the fabrication of semiconductor structures or devices, and to semiconductor structures or devices using engineered substrates.

BACKGROUND

Substrates that include one or more layers of semiconductor material are used to form a wide variety of semiconductor structures and devices including, for example, integrated circuit (IC) devices (e.g., logic processors and memory devices) and discrete devices such as, radiation emitting devices (e.g., light emitting diodes (LEDs), resonant cavity light emitting diodes (RCLEDs), vertical cavity surface emitting lasers (VCSELs)), and radiation sensing devices (e.g., optical sensors). Such semiconductor devices are conventionally formed in a layer-by-layer manner (i.e., lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is generally used to form active devices on the silicon wafer. However, in some device applications the majority of the silicon wafer thickness may be included in the electrical path-way of one or more device structures formed from the silicon wafer, such device structures being commonly referred to as "vertical" device structures.

So-called "engineered substrates" have been developed that include a relatively thin layer of semiconductor material (e.g., a layer having a thickness of less than about three hundred nanometers (300 nm)) disposed on a layer of dielectric material (e.g., silicon dioxide ($SiO_2$), silicon nitride ($Si_3N_4$), or aluminum oxide ($Al_2O_3$)). Optionally, the layer of dielectric material may be relatively thin (e.g., too thin to enable handling by conventional semiconductor device manufacturing equipment), and the semiconductor material and the layer of dielectric material may be disposed on a relatively thicker host or base substrate to facilitate handling of the overall engineered substrate by manufacturing equipment. As a result, the base substrate is often referred to in the art as a "handle" or "handling" substrate. The base substrate may also comprise a semiconductor material other than silicon.

A wide variety of engineered substrates are known in the art and may include semiconductor materials such as, for example, silicon (Si), germanium (Ge), III-V type semiconductor materials, and II-VI type semiconductor materials.

For example, an engineered substrate may include an epitaxial layer of III-V type semiconductor material formed on a surface of a base substrate, such as, for example, aluminum oxide ($Al_2O_3$) (which may be referred to as "sapphire"). The epitaxial layer may be formed on the surface of the base substrate by a transfer process from a donor structure, for example a donor substrate or donor ingot. The transfer from a donor structure may be desirable when the donor material is highly valuable or in scarce supply. Using such an engineered substrate, additional layers of material may be formed and processed (e.g., patterned) over the epitaxial layer of III-V type semiconductor material to form one or more devices on the engineered substrate. However, the coefficient of thermal expansion mismatch (or difference) between the epitaxial layer and the base substrate comprising the engineered substrate, may influence the formation and processing of the additional layers of material. For example, if the coefficient of thermal expansion mismatch between the epitaxial layer and the base substrate is substantial then the engineered substrate may be negatively impacted during the formation of additional layers of materials.

Examples of devices that can take advantage of engineered substrates are high power devices and photonic devices, such as, Light Emitting Diodes (LEDs) and laser diodes. FIG. 1 illustrates a conventional LED. A substrate 110, which may be an engineered substrate, includes an n-type layer 120 disposed thereon. An active region 130, which may include multiple layers, such as, for example, quantum wells, barrier layers, electron blocking layer(s) (EBL) etc., is disposed between the n-type layer 120 and a p-type layer 140. The result is an LED formed by the n-type layer 120, the active region 130, and the p-type layer 140. A first contact 160 provides an electrical connection to the n-type layer 120 and a second contact 150 provides another electrical connection to the to the p-type layer 140. These contacts may be opaque to the wavelength of light emitted by the LED and, as a result, may diminish the overall amount of light available from the LED. Thus, only the area between the first contact 160 and the second contact 150 may produce significant amounts of light. The physical layout of the second contact 150 relative to the n-type layer 120 may cause current crowding in the current flowing between the p-type layer 140 and the n-type layer 120. In addition, the physical layout may require that both p and n-type contacts are disposed on an upper surface of the LED structure, wherein such a physical layout may require removal of a portion of the device layers to expose regions for contacting. The removal of a portion of the device layers may increase the complexity of device fabrication, may reduce the area available for light generation and may also decrease device yield.

In view of the above, and for other reasons discussed below, there is a need for a substrate technology that provides a suitable base substrate for donated material from a donor structure. Moreover, there is a need for devices and methods that provide a support substrate with a closely matching Coefficient of Thermal Expansion (CTE) with that of an engineered substrate.

BRIEF SUMMARY

The various embodiments of the present invention generally relate to engineered substrates and methods of producing the engineered substrates that provide a suitable base substrate with a CTE that closely matches a CTE of the engineered substrate.

This summary is provided to introduce a selection of concepts in a simplified form that are further described in the detailed description below of some example embodiments of the invention. This summary is not intended to identify key features or essential features of the claimed subject matter, nor is it intended to be used to limit the scope of the claimed subject matter.

In some embodiments, the present invention includes methods of fabricating a semiconductor substrate, the methods include forming a weakened zone in a donor structure at a predetermined depth to define a transfer layer between an attachment surface and the weakened zone and a residual donor structure between the weakened zone and a surface opposite the attachment surface. A metallic layer is formed on the attachment surface and provides a matched Coefficient of Thermal Expansion (CTE) for the metallic layer that closely matches a CTE of the transfer layer, and sufficient stiffness to provide structural support to the transfer layer. The transfer layer is separated from the donor structure at the weakened zone to form a composite substrate comprising the transfer layer and the metallic layer.

In additional embodiments, the present invention includes methods of fabricating a semiconductor substrate, the methods include forming a weakened zone in a donor structure at a predetermined depth to define a transfer layer between an attachment surface and the weakened zone and a residual donor structure between the weakened zone and a surface opposite the attachment surface. An ohmic contact is formed between the transfer layer and a contact layer disposed thereon. A low impedance coupling is formed between a refractory metal layer and the contact layer, wherein the refractory metal layer provides a structural support for the semiconductor substrate. The methods also include separating the transfer layer from the donor structure at the weakened zone to form a composite substrate comprising the transfer layer the contact layer, and the refractory metal layer.

In other embodiments, the present invention comprises a semiconductor substrate including a metallic support substrate configured to provide a sufficient stiffness to the semiconductor substrate. The semiconductor substrate also includes a transfer layer comprising a semiconductor material in contact with an attachment surface of the metallic support substrate, wherein the transfer layer is detached from a donor structure comprising the semiconductor material and including a weakened zone in the donor structure at a predetermined depth from the attachment surface to define the transfer layer between the attachment surface and the weakened zone. A matched CTE of the metallic support substrate closely matches a CTE of the transfer layer.

Further aspects, details, and alternate combinations of the elements of embodiments of the invention will be apparent from the following detailed description.

BRIEF DESCRIPTION OF THE DRAWINGS

The present invention may be understood more fully by reference to the following detailed description of example embodiments of the present invention, which are illustrated in the appended figures in which:

FIG. 2 is a simplified cross-section drawing of a donor structure with a weakened zone to create a transfer layer;

FIGS. 3A and 3B are simplified cross-section drawings illustrating development of a composite substrate with a refractory metal carrier and a transfer layer according to one or more embodiments of the invention;

FIGS. 4A-4C are simplified cross-section drawings illustrating development of a composite substrate with a refractory metal carrier, a transfer layer, and a contact layer therebetween according to one or more embodiments of the invention;

DETAILED DESCRIPTION OF EMBODIMENTS OF THE INVENTION

Figure 1:
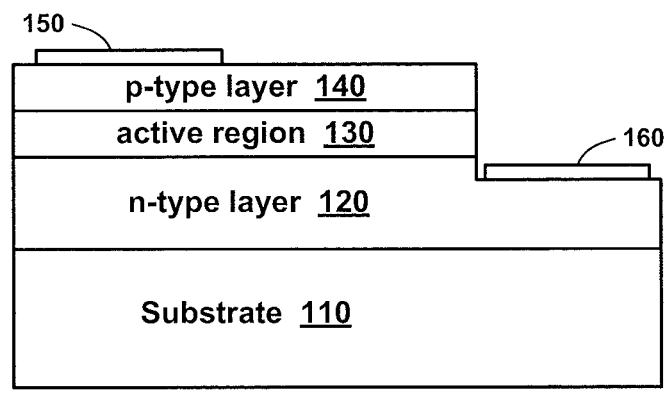
FIG. 1 is a simplified cross-section drawing of a conventional LED structure.

The illustrations presented herein are not meant to be actual views of any particular material, device, or method, but are merely idealized representations that are employed to describe embodiments of the present invention.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

The following description provides specific details, such as material types and processing conditions, in order to provide a thorough description of embodiments of the present disclosure and implementation thereof. However, a person of ordinary skill in the art will understand that the embodiments of the present disclosure may be practiced without employing these specific details and in conjunction with conventional fabrication techniques. In addition, the description provided herein does not form a complete process flow for manufacturing a semiconductor device or system. Only those process acts and structures necessary to understand the embodiments of the present invention are described in detail herein. The materials described herein may be formed (e.g., deposited or grown) by any suitable technique including, but not limited to, spin-coating, blanket coating, Bridgeman and Czochralski processes, chemical vapor deposition ("CVD"), plasma enhanced chemical vapor deposition ("PECVD"), atomic layer deposition ("ALD"), plasma enhanced ALD, or physical vapor deposition ("PVD"). While the materials described and illustrated herein may be formed as layers, the materials are not limited to layers and may be formed in other three-dimensional configurations.

Terms such as "horizontal" and "vertical," as used herein, define relative positions of elements or structures with respect to a major plane or surface of a semiconductor structure (e.g., wafer, die, substrate, etc.), regardless of the orientation of the semiconductor structure, and are orthogonal dimensions interpreted with respect to the orientation of the structure being described. As used herein, the term "vertical" means and includes a dimension substantially perpendicular to the major surface of a semiconductor structure, and the term "horizontal" means a dimension substantially parallel to the major surface of the semiconductor structure.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive materials, semiconductive materials, non-conductive materials (e.g., electrical insulators), and combinations thereof.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "III-V semiconductor" means and includes any semiconductor material that is at least predominantly comprised of one or more elements from group IIIA of the periodic table (e.g., B, Al, Ga, In, and Ti) and one or more elements from group VA of the periodic table (e.g., N, P, As, Sb, and Bi).

Unless specified differently, as used herein, the term "coefficient of thermal expansion," when used with respect to a material or structure, means the average linear coefficient of thermal expansion of the material or structure at room temperature.

As used herein, the term "engineered substrate," in its broadest sense, means and includes any substrate comprising two or more layers of material and that is intended to be used as a substrate for the fabrication of one or more semiconductor devices thereon. Engineered substrates include, as non-limiting examples, semiconductor-on-insulator type substrates.

As used herein, the term "sufficient stiffness" means a stiffness for a semiconductor structure that provides enough stiffness that structural damage due to plastic or elastic deformation does not occur to the semiconductor structure during subsequent processing or handling. As non-limiting examples, such structural damage may include, dislocations, cracking, crystal lattice damage, warp, bow and layer separation.

The various embodiments of the present invention are concerned with engineered substrates and methods of producing the engineered substrates that provide a suitable base substrate with a CTE that closely matches a CTE of the engineered substrate Embodiments of the invention may have applications to a wide range of silicon, germanium, silicon carbide, and III-V semiconductor materials as substrates. For example, the methods and structures of the embodiments of the invention may be applied to III-Nitrides, III-arsenides, III-phosphides and III-antimonides, in binary, ternary, quaternary and quinary form.

FIG. 2 is a simplified cross-section drawing of a donor structure 210 with a weakened zone 220 to create a transfer layer 230. As non-limiting examples, a detachment process described herein may use a SMART-CUT™ technology. Such processes are described in detail in, for example, U.S. Pat. No. RE39,484 to Bruel, U.S. Pat. No. 6,303,468 to Aspar et al.

U.S. Pat. No. 6,335,258 to Aspar et al., U.S. Pat. No. 6,756,286 to Moriceau et al., U.S. Pat. No. 6,809,044 to Aspar et al., U.S. Pat. No. 6,946,365 to Aspar et al., U.S. Pat. No. 7,531,428 to Dupont, U.S. Pat. No. 6,858,107 to Ghyselen et al., and U.S. Pat. No. 6,867,067 to Ghyselen et al., the disclosures of each of which are incorporated herein in their entirety by this reference. However, it should be understood that other processes suitable for manufacturing a compound material wafer that include utilizing predetermined weakened areas could also be used.

To perform this detachment process, a predetermined weakened zone 220 may be formed in the donor structure 210. FIG. 2 shows use of the SMART-CUT™ technology wherein atomic species 250, such as one or more of hydrogen ions, helium ions or other inert gas ions, are implanted through an attachment surface 240 with a dose and energy to create the weakened zone 220 in the donor structure 130. The weakened zone 220 is substantially parallel to the main attachment surface 240 and at a predetermined depth based on parameters of the atomic species implant process.

The transfer layer 230 is thus formed between the attachment surface 240 and the weakened zone 220. In addition, a residual donor structure is formed between the weakened zone 220 and an opposite surface from the attachment surface 240.

The donor structure 210 includes a semiconductor material and in some embodiments may include silicon, germanium, III-nitride (e.g., GaN, InGaN, AlGaN), and SiC. The semiconductor material may be un-doped or, for some applications, doped n+ or p+. The semiconductor may be a freestanding wafer as shown in FIG. 2 or a template structure, e.g., GaN on a sapphire base. The donor structure 210 may also comprise at least a portion of an ingot (or boule) of semiconductor material and in some embodiments the at least a portion of the ingot (or boule) may include silicon, germanium, III-nitride (e.g., GaN, InGaN, AlGaN), and SiC. The ingot (or boule) may comprise a structure such as those described in U.S. Pat. No. 6,858,107 to Ghyselen et al., and U.S. Pat. No. 6,867,067 to Ghyselen et al., the disclosures of each of which are incorporated herein in their entirety by this reference.

If the donor structure 210 is a III-nitride material, the polarity of the surface being implanted should be considered in determining the polarity of the final composite substrate. As a non-limiting example, a GaN donor structure may be used to develop a Gallium-polar face or a Nitrogen-polar face for subsequent processing. As a further non-limiting example, an InGaN donor structure may be used to develop a metal-polar face or a Nitrogen-polar face for subsequent processing.

For conventional layer transfer to a carrier wafer, typically a bonding process is used followed by splitting off of the implanted wafer by means of some heat treatment. The bonding process requires a high quality of the surfaces to be bonded to avoid large area defects (non-transferred areas) while the Coefficient of Thermal Expansion (CTE) of both wafers should not be too different to avoid wafer breakage as a result of the splitting process. For some applications, conductive bonding of a semiconductor material to a conductive substrate is desirable to construct vertical device structures, i.e., devices that have the active area near the surface of the semiconductor layer and a contact area near the interface of the semiconductor with the substrate or carrier wafer.

However, such an approach is difficult to realize as today most bonding processes involve layers of Silicon Dioxide ($SiO_2$) on the bonding faces to ensure a high quality bond. However, $SiO_2$ is an insulator and will make electrical conduction difficult, if not impossible and, in addition, impede efficient heat dissipation of the device to the substrate.

As a result, embodiments of the present invention provide structures and processes for providing a support structure that may provide heat dissipation and with a CTE that closely matches a CTE of the transfer layer 230. In some embodiments, an electrical contact may be developed, for example, an ohmic or Schottky contact, between the transfer layer 230 and a metallic carrier layer. An ohmic contact (i.e., a contact with a voltage independent resistance) is developed at a metal-semiconductor junction if the Schottky barrier height, is zero or negative. In other words, an ohmic contact will have current versus voltage characteristics that are substantially linear and symmetric. In such cases, the carriers are free to flow in or out of the semiconductor so that there is a minimal resistance across the ohmic contact.

FIGS. 3A and 3B are simplified cross-section drawings illustrating development of a composite substrate with a refractory metal layer 280 and a transfer layer 230 according to one or more embodiments of the invention. The refractory metal layer 310 may be formed to a thickness sufficient to form a metallic support substrate with sufficient stiffness to provide structural support to the transfer layer 230.

The refractory metal layer 310 is formed on the attachment surface 240 with a process suitable for providing an electrical contact, for example ohmic contact, between the refractory metal layer 310 and the transfer layer 230. Prior to depositing the refractory metal layer 310, the surface of the semiconductor may need treatment to remove any surface oxide or other surface layers that may impact the quality of the refractory metal layer 310, e.g., a thin gallium oxide layer may need to be removed prior to depositing the refractory metal layer 310 and for the formation of an electrical contact, e.g., an ohmic contact.

The entire structure of the donor structure 210 and the metallic support substrate 310 may be placed into a furnace (not shown) and heated so that the weakened zone 220 may be further weakened. With the weakening, the transfer layer 230 and accompanying metallic support substrate 310 may be separated from the donor structure at the weakened zone 220. Instead of providing thermal energy, additional energy in other forms, for example, mechanical energy, chemical energy, or a combination of thermal, mechanical energy, and chemical energies could be used during the weakening and detachment acts.

The structures thus formed after the separation are a residual donor structure (not shown) capable of donating further thin transfer layers and a composite substrate 450 including the metallic support substrate 310 and the transfer layer 230. As non-limiting examples, the transfer layer 230 may have a thickness of less than 1000 nanometers and more likely a thickness of about 500 nanometers.

As shown in FIG. 3B, the composite substrate 450 may be flipped over for additional processing on the exposed surface of the transfer layer 230. Prior to performing any further processing steps, the composite substrate 450 may receive a surface treatment, such as, for example, polishing, cleaning, or combination thereof Additional processing may include, as a non-limiting example, adding device structures on the composite structure. The device structures may include multiple layers of doped semiconductor material, un-doped semiconductor material, and active areas as are known in the art to produce electronic elements, photonic elements, and combinations thereof.

FIGS. 4A-4C are simplified cross-section drawings illustrating development of a composite substrate 450 with a refractory metal layer 310, a transfer layer 230, and a contact layer 410 therebetween according to one or more embodiments of the invention.

In the embodiments of FIGS. 4A-4C, a contact layer 410 of metal is deposited on the attachment surface 240. This contact layer 410 is configured to provide an ohmic contact that is high quality (e.g., low resistance) between the transfer layer 230 and the contact layer 410. As a non-limiting example, if the donor material is n+ doped GaN than the contact metal layer may be e.g., a Ti/Al/Ni/Au stack or a Ti/Al stack when the use of gold may be detrimental to the device performance. As another non-limiting example, if the donor material is p+ doped GaN then the contact metal layer may be e.g., Ni/Au stack or Ni (the first metal in the list being closest to the semiconductor). Prior to depositing the contact layer 410, the surface of the semiconductor may need treatment to remove any surface oxide or other surface layers which may impact the quality of the contact layer 410, e.g., a thin gallium oxide layer may need to be remove prior to depositing the contact layer 410. The contact layer 410 may be deposited by sputter coating, thermal evaporation, e-beam evaporation, etc. In some embodiments, the contact layer 410 may also function as a seed metal for subsequent deposition of a thick metal support, such a seed may be improve adhesion with the transfer layer 230 and improve electrical conduction properties with the transfer layer 230.

The contact layer 410 may be as thin as a few monolayers. In some embodiments, the contact layer 410 may have a thickness of about one nanometer to about 50 nanometers.

As shown in FIG. 4B, a refractory metal layer 310 is formed on the contact layer 410 with a process suitable for providing a low impedance coupling between the refractory metal layer 310 and the contact layer 410. In the embodiments of FIGS. 4A-4C, the combination of the contact layer 410 and the refractory metal layer 310 may be referred to herein as a metallic support substrate 310A.

The entire structure of the donor structure 210 and the metallic support substrate 310A may be placed into a furnace (not shown) and heated so that the weakened zone 220 may be further weakened. With the weakening, the transfer layer 230 and accompanying metallic support substrate 310A may be separated from the donor structure at the weakened zone 220. Instead of providing thermal energy, additional energy in other forms, for example, mechanical energy, chemical energy, or a combination of thermal, mechanical energy, and chemical energies could be used during the weakening and detachment steps.

The structures thus formed after the separation are a residual donor structure (not shown) capable of donating further thin transfer layers and a composite substrate 450 including the refractory metal layer 310, the contact layer 410, and the transfer layer 230. As non-limiting examples, the transfer layer 230 may have a thickness of less than 1000 nanometers and more likely a thickness of about 500 nanometers.

As shown in FIG. 4C, the composite substrate 450 may be flipped over for additional processing on the exposed surface of the transfer layer 230. Prior to performing any further processing steps, the composite substrate 450 may receive a surface treatment, such as, for example, polishing, cleaning, or combination thereof. Additional processing may include, as a non-limiting example, adding device structures on the composite structure. The device structures may include multiple layers of doped semiconductor material, un-doped semiconductor material, and active areas as are known in the art to produce electronic elements, photonic elements, and combinations thereof.

The residual donor structure may be re-used for forming additional composite structures by repeating the process as illustrated in FIG. 2 and FIGS. 3A and 3B or in FIG. 2 and FIGS. 4A and 4C. Prior to performing any further processing steps, the residual donor structure may need to receive a surface treatment, such as, for example, polishing, cleaning, or combination thereof in order to restore the original surface quality.

In both the embodiments of FIGS. 3A and 3B and FIGS. 4A-4C, the refractory metal layer 310 should be able to remain chemically and physically stable at temperatures high enough for subsequent processing, such as, for example, the heating for the separation and growth/deposition/processing of additional layers. As a non-limiting example, for subsequent processing of addition GaN layers, the refractory metal layer 310 should be able to withstand temperatures in the range of about 900°C. to about 1100°C. In addition, for subsequent processing the refractory metal layer 310 should be able to withstand the chemical environment within the additional growth/deposition/processing equipment.

The refractory metal layer 310 may be thick enough to provide sufficient stiffness to provide structural support to the transfer layer 230. As non-limiting examples, the refractory metal layer 310 may have a thickness between about 10 microns and about 150 microns and more likely a thickness between about 10 microns and about 20 microns. As non-limiting examples, the refractory metal layer 310 may be deposited by sputter coating, plasma spray coating or plating methods (e.g., electroless plating and electroplating).

The refractory metal layer 310 may have a matched CTE that closely matches a CTE of the transfer layer 230, for example to prevent strain and cracking during subsequent growth processes. Table 1 lists CTE values for some non-limiting materials for the transfer layer 230 and the refractory metal layer 310.

TABLE 1

| Material | CTE ($10^{-6}$/° K) |
|---|---|
| GaN | 5.6 |
| SiC | 4.5 |
| Tungsten | 4.5 |
| Molybdenum | 5.4 |
| Hafnium | 6.1 |
| Rhenium | 6.2 |
| Tantalum | 6.5 |
| Zirconium | 5.9 |

In some embodiments, the CTE of the refractory metal layer 310 may be within about 20% of the CTE, or within about 10% of the CTE of the semiconductor material of the transfer layer 230. Thus, for these embodiments tungsten, molybdenum, and zirconium used as the refractory metal layer 310 would closely match a SiC transfer layer 230 and in some embodiments particularly tungsten. Similarly, for these embodiments zirconium, hafnium, rhenium, and tantalum used as the refractory metal layer 310 would closely match a GaN transfer layer 230 and in some embodiments particularly molybdenum.

Since the stack of semiconductor/metal is CTE matched, thick epilayers of semiconductor material may be grown on the stack without cracking in order to complete the fabrication of a device structure. If needed, a thick metal wafer of the same kind as the sputtered/evaporated metal layer may serve as a carrier to add stiffness to the stack without losing its advantageous properties.

Figure 5A:
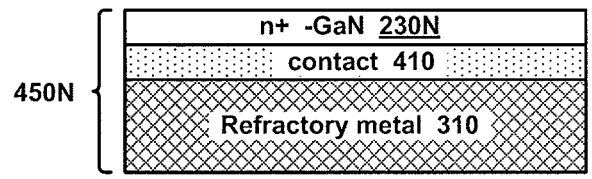
FIGS. 5A-5C illustrate a composite substrate with an n-doped Gallium Nitride (GaN) transfer layer and a photonic device formed on the composite substrate according to one or more embodiments of the invention.
Figure 5B:
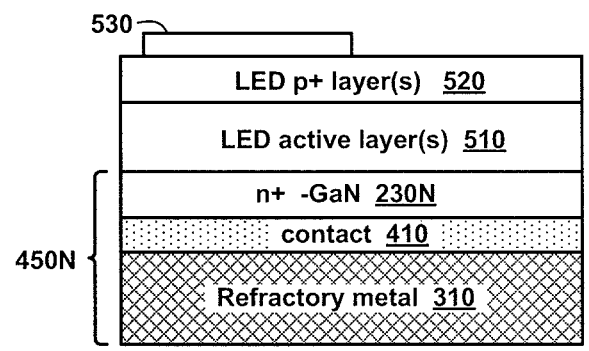
Figure 5C:
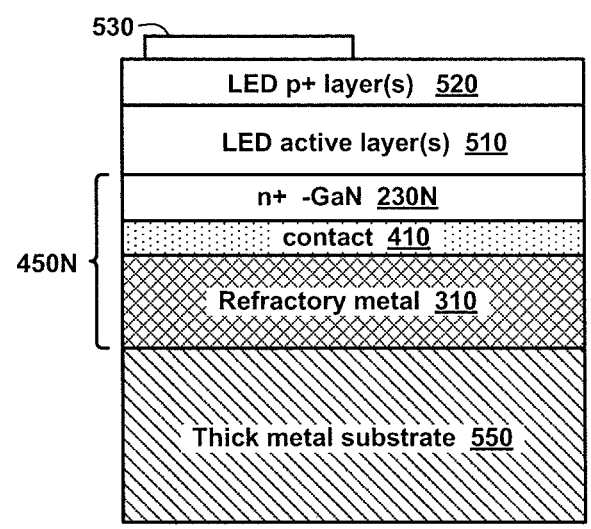

FIGS. 5A-5C illustrate a composite substrate 450N with an n-doped Gallium Nitride (GaN) transfer layer 230N and a photonic device formed on the composite substrate 450N according to one or more embodiments of the invention.

In FIG. 5A, the composite substrate 450N includes a transfer layer 230N of an n-doped GaN layer that is Ga polar on a Ti/Al/Ni/Au contact layer 410 on a refractory metal layer 310 (e.g., Molybdenum). The transfer layer 230 may be provided from either an n+GaN bulk or n+GaN (Ga polar) on sapphire template. Transfer from the n+GaN bulk may be effected with ion implantation into the n-face polar bulk. Deposition of the contact layer 410 and refractory metal layer 310 are followed by transfer layer separation of the transfer layer 230 from the bulk. Transfer for the n+GaN on sapphire would be effected with a double transfer to provide a Ga polar n+—GaN layer on the composite substrate.

FIG. 5B illustrates an LED structure, as a type of photonic device, comprised of additional semiconductor device on the composite substrate 450N. The LED structure includes an active region, which may include multiple layers, such as, for example, quantum wells disposed on the n-doped GaN transfer layer 230N. One or more p-type layers 520 are disposed on an active layer 510. The result is an LED formed by the n-doped GaN transfer layer 230N, the active layer 510, and the p-type layer 520. A contact layer 530 provides an electrical connection to the p-type layer 520.

The resulting LED structure provides a vertical diode structure, which, in contrast to the diode structure in FIG. 1, does not need an additional electrical connection exposed on the top layers for connection to the n-side of the diode.

FIG. 5C illustrates an optional further act to include a thick metal substrate 550. The supporting metal thickness can be increased by metal-to-metal bonding between the deposited refractory metal layer 310 and the thick metal substrate 550, this thickening of the metal support may be performed prior to device layer formation if the thick metal substrate 550 is capable of withstanding the corrosive reactor growth conditions.

Figure 6A:
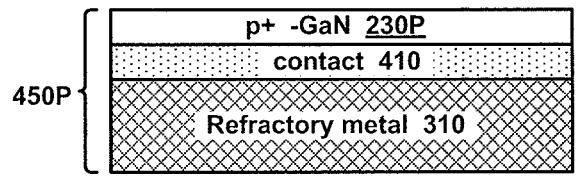
FIGS. 6A-6C illustrate a composite substrate with a p-doped Gallium Nitride (GaN) transfer layer and a photonic device formed on the composite substrate according to one or more embodiments of the invention.
Figure 6B:
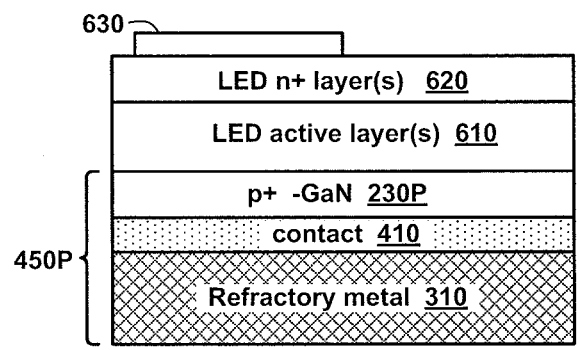
Figure 6C:
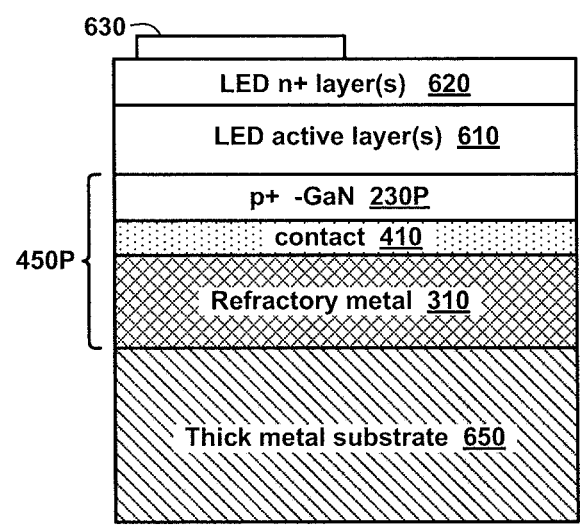

FIGS. 6A-6C illustrate a composite substrate 450P with a p-doped Gallium Nitride (GaN) transfer layer 230P and a photonic device formed on the composite substrate 450P according to one or more embodiments of the invention.

The layers in the embodiments of FIGS. 6A-6C are similar to those of the embodiments of FIGS. 5A-5C except the transfer layer 230 comprises a p-doped GaN transfer layer 230P. The corresponding contact layer 410 may be, for example, Ni/Au.

FIG. 6B illustrates an LED structure as a photonic device that includes an active region, which may include multiple layers, such as, for example, quantum wells disposed on the p-doped GaN transfer layer 230P. One or more n-type layers 620 are disposed on the active layer 610. The result is an LED formed by the p-doped GaN transfer layer 230P, the active layer 610, and the n-type layer 620. A contact layer 630 provides an electrical connection to the n-type layer 620.

The resulting LED structure provides a vertical diode structure, which, in contrast to the diode structure in FIG. 1, does not need an additional electrical connection exposed on the top layers for connection to the p-side of the diode.

FIG. 6C illustrates an optional further act to include a thick metal substrate 650. The supporting metal thickness can be increased by metal-to-metal bonding between the deposited refractory metal layer 310 and the thick metal substrate 650, this thickening of the metal support may be performed prior to device layer formation if the thick metal substrate 650 is capable of withstanding the corrosive reactor growth conditions.

Figure 7A:
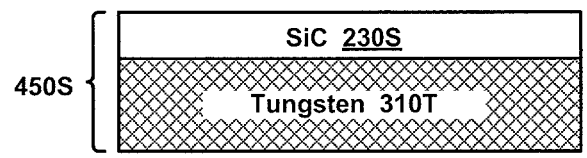
FIGS. 7A-7C illustrate a composite substrate with Silicon Carbide (SiC) transfer layer and a high power electronic device formed on the composite substrate according to one or more embodiments of the invention.
Figure 7B:
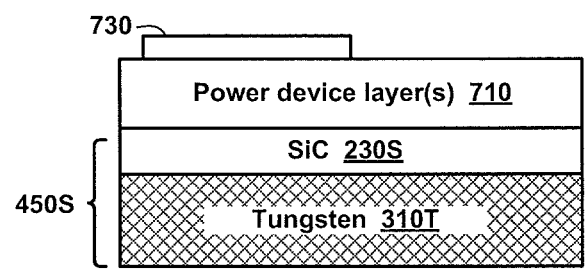
Figure 7C:
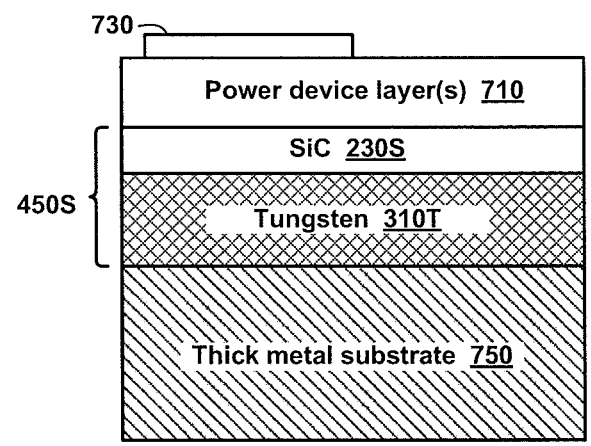

FIGS. 7A-7C illustrate a composite substrate 450S with a Silicon Carbide (SiC) transfer layer 230S and a high power electronic device formed on the composite substrate 450S according to one or more embodiments of the invention. The composite substrate 450S includes the SiC transfer layer 230S on the refractory metal layer 310, e.g., Tungsten 310T. As seen from Table 1, the SiC transfer layer 230 and the Tungsten refractory metal layer 310T are matched in CTE such that the SiC transfer layer 230 and high power electronic device formed thereon will experience little or no strain effects due to a CTE mismatch during device formation.

As illustrated in FIG. 7B, a power device may be formed with one or more power device layers 710 on the SiC transfer layer 230S. A contact layer 730 provides an electrical connection to the power device layer 710.

FIG. 7C illustrates an optional further act to include a thick metal substrate 750. The supporting metal thickness can be increased by metal-to-metal bonding between the deposited refractory metal layer 310 and the thick metal substrate 750, this thickening of the metal support may be performed prior to device layer formation if the thick metal substrate 750 is capable of withstanding the corrosive reactor growth conditions.

FIGS. 8A-8D illustrate a composite substrate with an n-doped Gallium Nitride (GaN) transfer layer 230 and a photonic device formed on the composite substrate 450, which is flipped to form a n-layer up photonic device according to one or more embodiments of the invention.

Figure 8A:
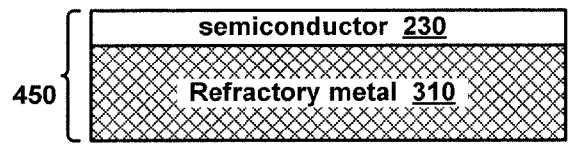
FIGS. 8A-8D illustrate a composite substrate with an n-doped Gallium Nitride (GaN) transfer layer and a photonic device formed on the composite substrate, which is flipped to form a n-layer up photonic device according to one or more embodiments of the invention.

The layers in the embodiment of FIG. 8A are similar to those of the embodiments of FIG. 3B. However, in contrast to the embodiments of FIGS. 4A-6C, the embodiments of FIGS. 8A-8D do not include a contact layer adjacent the composite substrate 450. Rather, a photonic device, such as, for example, an LED may be formed on the semiconductor material 230, which formed as an n-doped Gallium Nitride (GaN) transfer layer 230N in this embodiment.

Figure 8B:
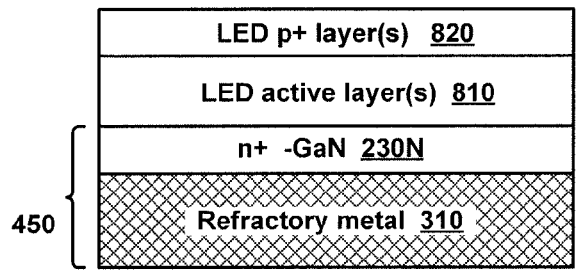

As shown in FIG. 8B, the photonic device may includes an active region 810, which may include multiple layers, such as, for example, quantum wells disposed on the n-type Gallium Nitride (GaN) transfer layer 230N. One or more p-type GaN layers 820 may be disposed on the active layer 810. The result is an LED formed by the n-type Gallium Nitride (GaN) transfer layer 230N, the active layer 810, and the p-type layer 820.

Figure 8C:
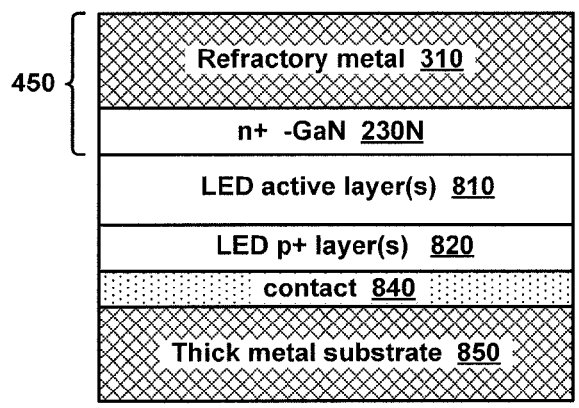
Figure 8D:
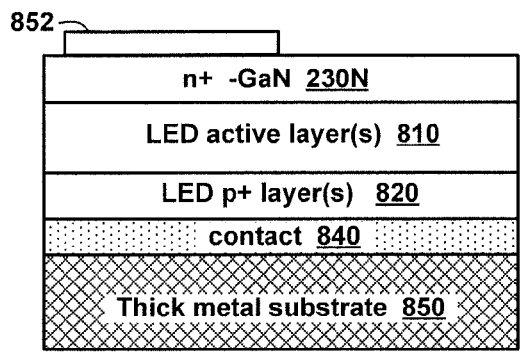

With the photonic device structure formed, a contact layer 840, such as those described above may be formed on the p-type GaN layer 820 providing an electrical connection to the p-type layer 820. A heat sink, such as, for example, a thick metal substrate 850 may be formed on the contact layer 810. The resulting structure may be thought of as flipped. The flipped configuration is illustrated in FIG. 8C. The refractory metal 310 may then be removed to expose the n-type Gallium Nitride (GaN) transfer layer 230N.

The resulting LED structure provides a vertical diode structure, which, in contrast to the diode structure in FIG. 1, does not need an additional electrical connection exposed on the top layers for connection to the p-side of the diode. Rather, the p-side of the diode may be contacted through the contact layer 840 and the thick metal substrate 850. A contact layer 852 may be formed to provide an electrical connection to an n-doped Gallium Nitride (GaN) transfer layer 230N.

The embodiments of the invention described above do not limit the scope the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims.

What is claimed is:

1. A method of fabricating a semiconductor substrate, comprising:
    forming a weakened zone in a donor structure at a predetermined depth to define a transfer layer between an attachment surface and the weakened zone and a residual donor structure between the weakened zone and a surface opposite the attachment surface;
    depositing a metallic layer on the attachment surface and forming a metallic support structure comprising the metallic layer on the attachment surface, wherein the metallic layer provides:
        a matched Coefficient of Thermal Expansion (CTE) for the metallic layer that closely matches a CTE of the transfer layer; and
        sufficient stiffness to provide structural support to the transfer layer; and
    separating the transfer layer from the donor structure at the weakened zone to form a composite substrate comprising the transfer layer and the metallic layer.

2. The method of claim 1, wherein depositing the metallic layer on the attachment surface further comprises forming the metallic layer to provide an ohmic contact between the metallic layer and the transfer layer.

3. The method of claim 1, wherein depositing the metallic layer on the attachment surface further comprises forming the metallic layer to provide a Schottky contact between the metallic layer and the transfer layer.

4. The method of claim 1, wherein forming the weakened zone in the donor structure comprises forming the weakened zone in at least a portion of an ingot of semiconductor material or a boule of semiconductor material.

5. The method of claim 1, wherein depositing the metallic layer on the attachment surface comprises:
    depositing a contact layer on the attachment surface, the contact layer providing an electrical contact with the transfer layer; and
    depositing a refractory metal layer on the contact layer, the refractory metal layer conductively coupled with the contact layer, wherein the refractory metal layer is relatively thick compared to the contact layer, provides the sufficient stiffness, and provides the matched CTE.

6. The method of claim 1, wherein the matched CTE is within 10% of the CTE of the transfer layer.

7. The method of claim 1, further comprising selecting the donor structure from the group consisting of silicon, germanium, SiC, GaN, AlN, InGaN and GaAs.

8. The method of claim 7, wherein selecting the donor structure further comprises selecting the donor structure to have a sapphire base attached to the donor structure opposite the attachment surface.

9. The method of claim 1, further comprising selecting the donor structure to include SiC and selecting the metallic layer to include tungsten or molybdenum.

10. The method of claim 9, further comprising selecting the donor structure to include SiC and selecting the metallic layer to include tungsten.

11. The method of claim 1, further comprising selecting the donor structure to include GaN and selecting the metallic layer to include molybdenum, zirconium, hafnium, rhenium, or tantalum.

12. The method of claim 11, further comprising selecting the donor structure to include GaN and selecting the metallic layer to include molybdenum.

13. The method of claim 1, further comprising forming additional semiconductor structures within the transfer layer, on the transfer layer, or a combination thereof.

14. A method of fabricating a semiconductor substrate, comprising:
forming a weakened zone in a donor structure at a predetermined depth to define a transfer layer between an attachment surface and the weakened zone and a residual donor structure between the weakened zone and a surface opposite the attachment surface;
depositing metal on the transfer layer to form a contact layer and establishing an ohmic contact between the transfer layer and the contact layer disposed thereon;
depositing a refractory metal on the contact layer to form a refractory metal layer and establishing a low impedance coupling between the refractory metal layer and the contact layer, wherein the refractory metal layer provides a structural support for the semiconductor substrate; and
separating the transfer layer from the donor structure at the weakened zone to form a composite substrate comprising the transfer layer, the contact layer, and the refractory metal layer.

15. The method of claim 14, further comprising selecting the refractory metal such that the refractory metal layer has a matched Coefficient of Thermal Expansion (CTE) relative to a CTE of the transfer layer.

16. The method of claim 14, further comprising forming the contact layer to have a thickness between about one nanometer and about 50 nanometers.

17. The method of claim 14, further comprising forming the refractory metal layer to a have thickness between about 10 microns and about 150 microns.

18. The method of claim 14, wherein depositing metal on the transfer layer to form the contact layer comprises depositing the metal using one or more of a sputter coating process, a thermal evaporation process, and an e-beam evaporation process.

19. The method of claim 14, wherein depositing the refractory metal on the contact layer to form the refractory metal layer comprises depositing the refractory metal using at least one of a sputter coating process, an evaporation process, a spray coating process, an electroless plating process, and an electroplating process.

20. The method of claim 14, further comprising selecting the donor structure from the group consisting of silicon, germanium, SiC, GaN, AlN, InGaN and GaAs.

21. The method of claim 20, wherein selecting the donor structure further comprises selecting the donor structure to have a sapphire base attached to the donor structure opposite the attachment surface.

22. The method of claim 14, further comprising re-using the residual donor structure to form an additional composite substrate.

23. A semiconductor substrate, comprising:
a transfer layer comprising a semiconductor material;
a deposited metallic support substrate formed on the transfer layer and configured to provide a sufficient stiffness to the semiconductor substrate;
wherein a matched Coefficient of Thermal Expansion (CTE) of the metallic support substrate closely matches a CTE of the transfer layer.

24. The semiconductor substrate of claim 23, wherein the deposited metallic support substrate comprises:
a deposited contact layer formed on the transfer layer and providing a conductive contact with the transfer layer; and
a deposited refractory metal layer formed on the contact layer on a side thereof opposite the transfer layer, the refractory metal layer conductively coupled with the contact layer, wherein the refractory metal layer provides sufficient stiffness to provide structural support for the semiconductor substrate and provides the matched CTE.

25. The semiconductor substrate of claim 24, wherein the conductive contact comprises an ohmic contact.

26. The semiconductor substrate of claim 24, wherein the conductive contact comprises a Schottky contact.

27. The semiconductor substrate of claim 24, wherein the matched CTE is within 20% of the CTE of the transfer layer.

28. The semiconductor substrate of claim 24, wherein the transfer layer comprises SiC and the deposited refractory metal layer includes at least one of tungsten, molybdenum, and zirconium.

29. The semiconductor substrate of claim 24, wherein the transfer layer comprises GaN and the deposited refractory metal layer includes at least one of zirconium, hafnium, rhenium, and tantalum.

30. The semiconductor substrate of claim 24, wherein the transfer layer comprises n-doped GaN and the deposited contact layer includes at least one of titanium, aluminum, nickel, and gold.

31. The semiconductor substrate of claim 24, wherein the transfer layer comprises p-doped GaN and the deposited contact layer includes at least one of nickel and gold.

32. The semiconductor substrate of claim 24, further comprising a thick metal substrate conductively coupled with and adjacent the deposited refractory metal layer.

33. The semiconductor substrate of claim 23, wherein the transfer layer comprises n-doped GaN and further comprising semiconductor device layers integrated on the transfer layer to form at least one photonic element.

34. The semiconductor substrate of claim 23, wherein the transfer layer comprises p-doped GaN and further comprising semiconductor device layers integrated on the transfer layer to form at least one photonic element.

35. The semiconductor substrate of claim 23, wherein the transfer layer comprises SiC and further comprising semiconductor device layers integrated on the transfer layer to form at least one high power electronic device.

36. The method of claim 1, wherein separating the transfer layer from the donor structure at the weakened zone to form the composite substrate comprises separating the residual donor structure from the transfer layer after depositing the metallic layer on the attachment surface to form the metallic support structure comprising the metallic layer on the attachment surface.

37. The method of claim 1, wherein depositing the metallic layer on the attachment surface to form the metallic support structure comprising the metallic layer on the attachment surface comprises depositing the metallic layer on the attachment surface using at least one of a sputter coating process, an evaporation process, a spray coating process, an electroless plating process, and an electroplating process.

* * * * *